United States Patent [19]

Swift et al.

[11] Patent Number: 5,359,252

[45] Date of Patent: Oct. 25, 1994

[54] LEAD MAGNESIUM NIOBATE ACTUATOR FOR MICROPOSITIONING

[75] Inventors: Charles D. Swift, Livermore; John W. Bergum, Concord, both of Calif.

[73] Assignee: The United States of America as represented by the United States Department of Energy, Washington, D.C.

[21] Appl. No.: 39,614

[22] Filed: Mar. 30, 1993

[51] Int. Cl.⁵ .................................. H01L 41/08
[52] U.S. Cl. ............................. 310/328; 310/344
[58] Field of Search ............. 310/326, 328, 340, 344, 310/366

[56] References Cited

U.S. PATENT DOCUMENTS

| | | | |
|---|---|---|---|
| 3,075,098 | 1/1963 | Shoor | 310/329 |
| 3,167,951 | 2/1965 | Wintriss | 73/660 |
| 4,460,842 | 7/1984 | Waanders et al. | 310/328 |
| 4,588,268 | 5/1986 | Aldrich | 350/607 |
| 4,657,358 | 4/1987 | Anthony et al. | 350/610 |
| 4,679,915 | 7/1987 | Kriz et al. | 350/611 |
| 4,781,477 | 11/1988 | Nagasawa | 310/328 |
| 4,845,399 | 7/1989 | Yasuda et al. | 310/366 |
| 4,899,076 | 2/1990 | Kato | 310/344 |
| 4,932,119 | 6/1990 | Ealey et al. | 29/593 |
| 5,074,654 | 12/1991 | Alden et al. | 359/849 |
| 5,113,108 | 5/1992 | Yamashita et al. | 310/328 |
| 5,166,907 | 11/1992 | Newnham et al. | 367/157 |
| 5,205,147 | 4/1993 | Wada et al. | 310/328 |
| 5,210,653 | 5/1993 | Schell | 310/328 |

FOREIGN PATENT DOCUMENTS 0080579  4/1991  Japan ...................... 310/328

Primary Examiner—Thomas M. Dougherty
Attorney, Agent, or Firm—Miguel A. Valdes; Roger S. Gaither; William R. Moser

[57] ABSTRACT

An improved lead magnesium niobate actuator is disclosed comprising a cylindrical lead magnesium niobate crystal stack mounted in a cylindrical casing wherein a bias means, such as one or more belleville washers, is located between one end of the crystal stack and a partially closed end of the casing; and adjustment means are provided which bear against the opposite end of the crystal stack, whereby an adjustable compressive force is constantly applied against the crystal stack, whether the crystal stack is actuated in an extended position, or is in an unactuated contracted position. In a preferred embodiment, cooling ports are provided for the circulation of coolant in the actuator to cool the crystal stack, and provision is made for removal and replacement of the crystal stack without disconnecting the actuator from the external device being actuated.

24 Claims, 1 Drawing Sheet

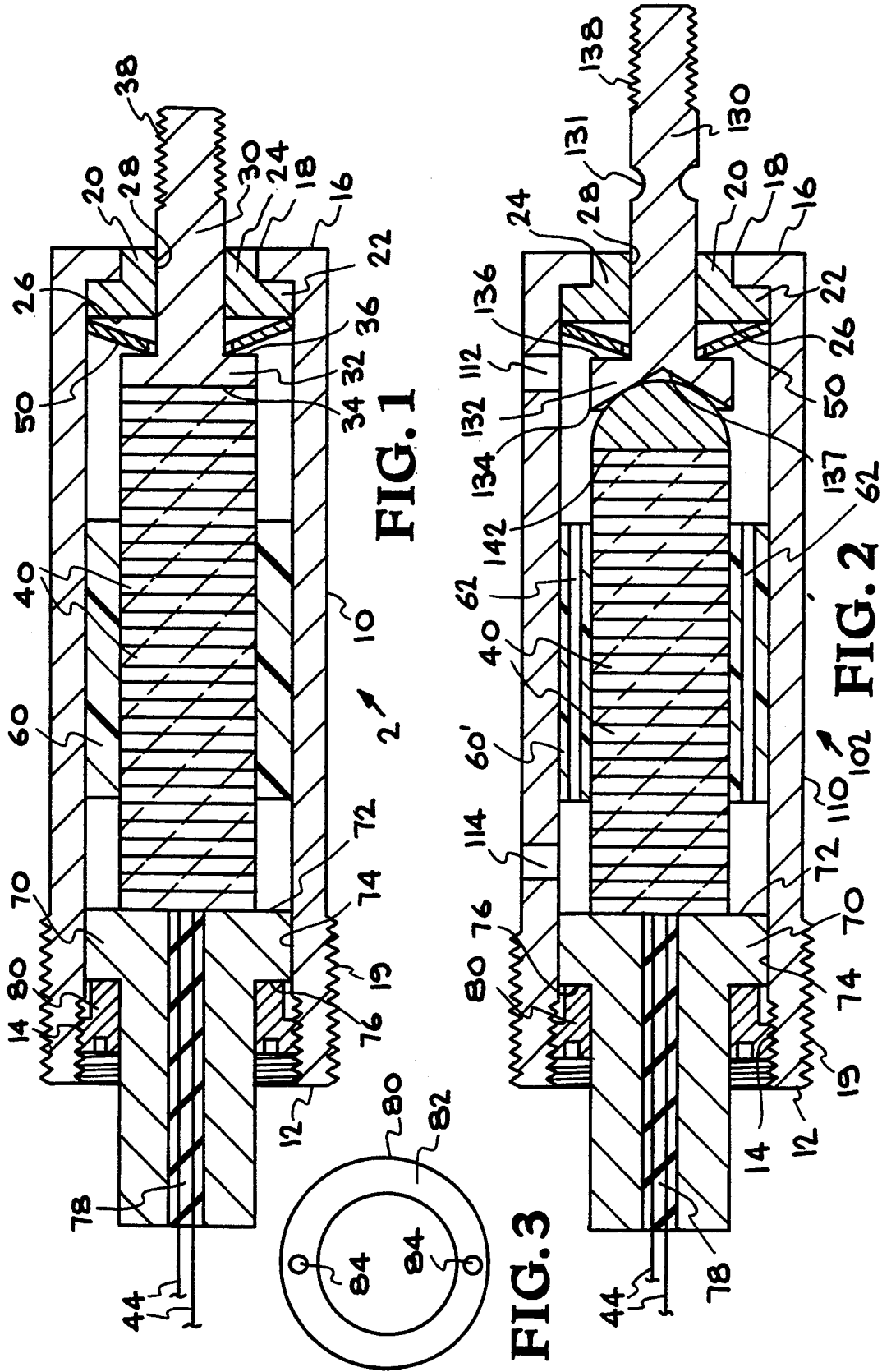

LEAD MAGNESIUM NIOBATE ACTUATOR FOR MICROPOSITIONING

The invention described herein arose in the course of, or under, Contract No. W-7405-ENG-48 between the United States Department of Energy and the University of California for the operation of the Lawrence Livermore National Laboratory.

BACKGROUND OF THE INVENTION

Micropositioning actuators are used for precision movement of optical and mechanical devices small distances, i.e. micrometers ($\mu$m), with accuracies comparable to the wave length of light at rates up to a few kilohertz. Such micropositioning actuators are commercially available constructed of either lead zirconium titanate or lead magnesium niobate. In either instance, the actuators are formed using a crystal stack which comprises thin plates of the respective crystals interleaved between thin metal electrodes. Alternate metal electrodes are electrically connected together so that the electrodes on opposite sides of each crystal plate are oppositely charged, when a voltage is applied to the electrodes. Such an applied voltage on the electrodes causes the crystal layers to expand or swell. When a series of such crystal layers and interleaved electrodes are bonded together into a stack and a voltage is applied to the electrodes, the stack will expand along the axis normal to the planes of the stack layers and then contract, i.e., move in the opposite direction, when the voltage is removed. The precise movement which results from applying and removing a voltage to and from such a crystal stack may be used, for example, to deform mirrors to correct optical wavefronts (adaptive optics).

Actuators made with lead magnesium niobate crystal stacks are more desirable than actuators made with lead zirconium titanate stacks where stability (lack of sagging) is important. However, lead magnesium niobate crystals are fragile. When the interleaved crystal/electrode layers comprising the actuator are all bonded together and the actuator is firmly fixed, i.e., bonded, to the object to be moved, e.g., a deformable mirror, the forces exerted on the crystal stack during contraction can cause damage to the crystal layers as each crystal layer exerts a contractive or pulling force on its opposite surfaces against the electrodes to which these crystal surfaces are respectively bonded. Such contractive forces exerted by each crystal layer against adjacent metal electrode layers to which the crystal is bonded on its opposite sides can tend to pull some of the crystals in the stack apart if the forces are great enough.

Since one of the intended uses of such an actuator is to deform a mirror, wherein the contractive forces may be as high as 200 Newtons, such potential damage to lead magnesium niobate actuators has limited the use of actuators made from this material for such purposes.

It would, therefore, be desirable to provide a lead magnesium niobate actuator wherein such contractive forces do not cause damage to the lead magnesium niobate crystal stack.

SUMMARY OF THE INVENTION

It is, therefore, an object of this invention to provide an improved lead magnesium niobate actuator wherein an external compressive bias is applied constantly against the crystal stack so that during contraction of the crystal stack, the resulting compressive force will be evenly distributed across all the layers of the crystal stack.

This is carried out by mounting the lead magnesium niobate crystal stack in a casing wherein a compressive force, resulting from bias means such as a partially compressed belleville washer, is constantly applied against one end of the stack and an adjustable mechanism in contact with the opposite end of the crystal stack is used during assembly to adjust the amount of the bias force exerted against the crystal stack.

Other aspects and advantages of the invention will be readily understood from the following description and accompanying drawings.

BRIEF DESCRIPTION OF THE DRAWINGS

FIG. 1 is a vertical cross-sectional view of the basic actuator of the invention illustrating the application of a compressive force constantly to the crystal stack by a partially compressed belleville washer in contact with one end of the stack.

FIG. 2 is a vertical cross-sectional view of an actuator similar to that shown in FIG. 1, but showing additional features incorporated into the best mode of the actuator which comprises the invention.

FIG. 3 is an end view of an adjustable sleeve used in the actuators shown in FIGS. 1 and 2 to move the crystal stack toward or away from the belleville washer to set the compressive force on the crystal stack.

DETAILED DESCRIPTION OF THE INVENTION

Turning now to FIG. 1, the lead magnesium niobate actuator of the invention, generally designated at 2, is shown in its simplest form. A cylindrical casing 10 houses a cylindrical lead magnesium niobate crystal stack 40 which is bonded to a shaft 30 which protrudes from casing 10 of actuator 2. When a voltage is applied to crystal stack 40, the stack expands, thereby moving shaft 30 along the axis of casing 10 and crystal stack 40, i.e., moving the protruding end of shaft 30 away from casing 10 and crystal stack 40. When the voltage is removed, crystal stack 40 contracts, moving shaft 30 in the opposite direction.

In accordance with a basic feature of the invention, a bias means 50, illustrated in FIG. 1 as a belleville washer, is positioned in a partially compressed mode between the inner end of casing 10 and one end of crystal stack 40 so that expansion of crystal stack 40 results in further compression of bias means 50. Subsequent contraction of crystal stack 40 (when the voltage is reduced or removed) allows bias means 50 to expand. In this manner, in accordance with the invention, the constant bias tension of bias means 50 against crystal stack 40 prevents excessive stress from developing between any single crystal layer and bonded adjoining layers of metal electrodes. In essence, crystal stack 40 is no longer pulling itself back into a contracted position (when the voltage is removed). Rather bias means 50 is urging or pushing crystal stack 40 back into a contracted mode by the force of bias means 50 being exerted against crystal stack 40.

Referring now in further detail to actuator 2 of the invention depicted in FIG. 1, casing 10 is provided with an open end 12 having internal threads 14 therein, and a closed end 16, having a central opening 18 therein. A cylindrical bushing or guide 20 is shown mounted in central opening 18 of casing 10. Bushing 20 has an enlarged portion 22 with an outer diameter approximately the same as the inner diameter of casing 10, and a smaller portion 24 having an outer diameter approximately the same as the diameter of opening 18 to thereby permit a snug fit of bushing 20 into opening 18. The end of bushing 20 mounted within casing 10 defines a surface 26 which faces crystal stack 40. Bushing 20 is further provided with a central bore 28 having a diameter slightly larger than shaft 30 to permit shaft 30 to be slidably mounted therein.

Shaft 30 has an enlarged head 32 at one end thereof with a flat surface 34 to which is bonded, in this embodiment, one end of crystal stack 40. The underside of head 32 defines a shoulder 36 facing surface 26 of sleeve 20. Shaft 30 has an externally threaded opposite end 38 to facilitate attachment of actuator 2 to the structure to be moved by actuator 2.

Bushing 20 and shaft 30 are both preferably constructed of metal for purposes of strength. However, the respective wear surfaces of both are preferably coated with materials which will reduce both wear and friction. In a preferred embodiment, bushing 20 is provided with a titanium nitride coating thereon, and shaft 30 is provided with a lubricated nickel alloy coating thereon, such as available under the trademark NEDOX from the General Magnaplate Corporation.

Positioned between surface 26 of sleeve 20 and shoulder 36 of enlarged head 32 on shaft 30 is a bias means 50. Bias means 50 comprises a compressible material such as, for example, a spring means. In the preferred embodiment, as shown in FIG. 1, bias means 50 may comprise one or more belleville washers. As will be further explained below, bias means 50 is mounted between sleeve 20 and head 32 of shaft 30 in a partially compressed mode, so that a bias force is exerted against head 32 of shaft 30, and thereby against crystal stack 40, even when crystal stack 40 is not activated by a voltage, i.e., is not in an expanded mode.

In the preferred embodiment, bias means 50 comprises a bias material capable of exerting a force of abut 200 Newtons when compressed about 50%, and is also coated with a friction-reducing material such as molybdenum disulfide. When a belleville washer comprise bias means 50, more than one such washer may be used to achieve the desired compressive force.

In the illustrated embodiment of FIG. 1, a cylindrical spacer 60 may be positioned within casing 10 and around crystal stack 40 to center crystal stack 40 during assembly.

Crystal stack 40 comprises a commercially available lead magnesium niobate structure available, for example, from the AVX Company of Myrtle Beach, S.C. Such crystals stacks are available in various sizes and voltages to provide various degrees of movement. One such commercially available unit is 20 millimeters (mm) long, 6 mm in diameter, and is rated at 150 volts maximum to provide a maximum expansion of 15 $\mu$m. Crystal stack 40 is provided with leads 44 which may be connected to an external electrical power source (not shown).

Crystal stack 40, as mentioned above, is bonded at one end to surface 34 of head 32 of shaft 30. Such bonding may be done using a bonding material such as, for example, an epoxy bonding agent such as HYSOL EA9330, available from the Dexter Company. At its opposite end, crystal stack 40 is bonded, using a similar bonding agent, to an upper surface 72 of a cylindrical base member 70 having an outer diameter approximately equal to the inner diameter of casing 10.

Cylindrical side surface 74 on base member 70 assists in the coaxial positioning of crystal stack 40 within casing 10. Base member 70 is further provided with a shoulder portion 76 which is used as a bearing surface against which an externally threaded nut member 80 bears to thereby adjustably urge crystal stack 40 and enlarged head 32 on shaft 30 toward bias means 50. Bores 78 may be provided in base member 70 for electrical leads 44 from crystal stack 40.

Externally threaded adjustment nut 80 is screwed into threads 14 in open end 12 of casing 10. As shown in FIG. 3, adjustable nut 80 is provided, in an end surface 82 thereof, with bores 84 into which a spanner wrench may be inserted to permit rotation of nut 80 in casing 10.

To assemble actuator 2 of FIG. 1, bushing 20 is first inserted into central bore 18 in casing 10. Spacer 60 is then placed around crystal stack 40 and belleville washer 50 is placed over shaft 30 to rest on shoulder 36 of enlarged head 32. Crystal stack 40, with shaft 30 and base 70 already bonded thereto, is then inserted into open end 12 of casing 10, with shaft 30 then entering bore 28 in bushing 20, until belleville washer 50 contacts surface 26 of bushing 20. Sleeve 80 is then screwed into casing 10 to bear against shoulder 72 of base 70, thereby compressing belleville washer 50. Optimally, adjustment sleeve or nut 80 is then further tightened until belleville washer is about 50% compressed. This can be determined by measuring the movement of the portion of shaft 30 protruding from casing 10. For example, for a belleville washer having a total force of 400 Newtons, when fully compressed, a 50% compression of belleville washer 50, resulting in a preload of about 200 Newtons on crystal stack 40, will result in a 100 micrometer movement of shaft 30.

Turning now to FIG. 2, a preferred embodiment of the actuator of the invention is shown as 102. In this embodiment, where identical features will be designated by the same numbers, casing 110 is provided with openings or ports 112 and 114 through which coolant may be circulated to assist in maintaining temperature over crystal stack 40 therein.

A modified shaft 130 is provided with one or more annular grooves 131 which provide a weakness or yield points to permit flexure of the threaded end of shaft 130 (which may be caused by lateral movement of the load to which shaft 130 is attached) without causing stress on the remainder of actuator 102 and, in particular, without putting stress on crystal stack 40.

To facilitate replacement of crystal stack 40 without disconnecting shaft 130 from the external load to which it is attached, in this embodiment shaft 130 is not bonded to crystal stack 40. Instead surface 134 on enlarged head 132 of shaft 130 is provided with a conical indenture or bore 137 which receives a hemispherical metallic head 142 which is bonded to the upper end of crystal stack 40. Since hemispherical head 142 is not bonded to head 132 of shaft 130, removal of crystal stack 40 is possible without disengaging shaft 130 from the external load. This is possible by unscrewing sleeve 80 from casing 110 and withdrawing crystal stack 40 and base 70 which are attached to each other. A replacement crystal stack 40 and base 70 can then be installed and the preload reset by screwing sleeve 80 back into casing 110 again.

In view of this construction, the need for spacer 60 of the FIG. 1 embodiment is reduced and spacer 60 can, therefore, be eliminated. Such elimination is desirable when coolant is to be circulated through casing 120 since the presence of spacer 60 would block such flow unless its construction was modified to provide coolant passages through spacer 60' such as shown at 62 in FIG. 2.

As in the embodiment of FIG. 1, bias means 50 provides a compressive force against crystal stack 40 which is adjustable by rotation of threaded nut 80 in threaded open end 12 of casing 110. In this instance, bias means 50 (shown again as a belleville washer) bears against a shoulder 136 on enlarged head 132 of shaft 130.

Thus, in the embodiment of FIG. 2, the structure to be deflected, which is attached to the threaded end 138 of shaft 130, is operationally coupled to crystal stack 40 as in the embodiment of FIG. 1, but unlike the embodiment of FIG. 1, the external structure to be deflected is not rigidly bonded to crystal stack 40. Instead hemispherical head 142 attached to the end of crystal stack 40, is free to be removed and replaced as needed. Furthermore, annular groove or grooves 131 in shaft 130 adjacent its threaded end 138 absorb lateral movement or stress from the structure to be deflected.

Thus, the invention provides an improved lead magnesium niobate actuator wherein bias means provide a constant compressive force against the crystal stack which acts to compress the crystal stack during contraction of the stack when the voltage is removed or lowered after expansion of the crystal stack, thus inhibiting localization of stresses between the bonded together layers in the crystal stack as the stack contracts. Furthermore, in the preferred embodiment, the shaft connected to the structure to be deflected is operationally, but not rigidly, coupled to the crystal stack, and the shaft is provided with flexure means, whereby lateral movements and stresses are not transmitted from the shaft to the crystal stack.

While specific embodiments of the lead magnesium niobate actuator of the invention have been illustrated and described, modifications and changes of the apparatus, parameters, materials, etc. will become apparent to those skilled in the art, and it is intended to cover in the appended claims all such modifications and changes which come within the scope of the invention.

What is claimed is:

1. A lead magnesium niobate actuator for micropositioning which comprises:
   a) a cylindrical casing having an open end and a partially closed end, said partially closed end having a central opening therein of smaller diameter than the inner diameter of said casing;
   b) a cylindrical lead magnesium niobate crystal stack mounted within said casing, said crystal stack:
      i) having a smaller diameter than the inner diameter of said casing;
      ii) having a generally hemispherical end portion bonded to one end of said stack; and
      iii) being electrically actuatable from a contracted position to an extended position;
   c) a shaft member received in said central opening in said partially closed end of said casing, said shaft member having a threaded end portion outside of said casing and an enlarged head portion within said casing, said enlarged head portion of said shaft formed with a central conical opening in a surface facing said one end of said crystal stack to receive said hemispherical head bonded to said one end of said crystal stack;
   d) bias means located between the inner portion of said closed end of said casing and a surface on said enlarged head portion of said shaft, to urge said head portion of said shaft toward said hemispherical head bonded to said one end of said crystal stack; and
   e) adjustable means within said casing and adjacent an opposite end of said crystal stack for adjustably urging said crystal stack against said enlarged head on said shaft;

whereby said adjustable means and said bias means cooperate to exert an adjustable compressive force constantly against opposite ends of said crystal stack.

2. The lead magnesium niobate actuator of claim 1 wherein said bias means comprises a spring bias means.

3. The lead magnesium niobate actuator of claim 2 wherein said spring bias means comprises one or more belleville washers.

4. The lead magnesium niobate actuator of claim 3 wherein said one or more belleville washers are coated with a friction-reducing material.

5. The lead magnesium niobate actuator of claim 1 wherein a bushing is fitted into said central opening in said partially closed end of said casing, and said shaft passes through a central bore in said bushing.

6. The lead magnesium niobate actuator of claim 5 wherein said bushing and said shaft have dissimilar materials on their respective surfaces to reduce wear and/or friction therebetween.

7. The lead magnesium niobate actuator of claim 1 wherein said enlarged head on said shaft is bonded to said one end of said crystal stack.

8. The lead magnesium niobate actuator of claim 1 wherein said shaft has one or more grooves circumferentially formed thereon whereby lateral forces applied against said threaded end of said shaft will cause said shaft to flex at said one or more grooves and the transmission of said lateral forces applied against the end of said shaft to said crystal stack will be inhibited.

9. The lead magnesium niobate actuator of claim 1 wherein said casing is provided with entrance and exit ports to permit cooling means to circulate within said casing around said crystal stack.

10. The lead magnesium niobate actuator of claim 9 wherein spacer means are located within said casing around said crystal stack to centrally position said crystal stack within said casing, and passages are provided within said spacer means to allow said coolant to circulate around a portion of said crystal stack.

11. The lead magnesium niobate actuator of claim 1 wherein a cylindrical base member is mounted to said opposite end of said crystal stack to coaxially position said cylindrical crystal stack within said casing, said base member having an outer diameter approximately equal to the inner diameter of said casing to provide a snug fit therebetween.

12. The lead magnesium niobate actuator of claim 11 wherein said adjustable means comprises an externally threaded sleeve, said casing is provided with mating internal threads adjacent said open end thereof, and one end of said threaded sleeve engages a shoulder portion of said cylindrical base member when said threaded sleeve is received in said open end of said casing, whereby said threaded sleeve may be rotated to urge said cylindrical base member, said crystal stack, and said enlarged head on said shaft, against said bias means to thereby adjust the compressive force on said crystal stack.

13. The lead magnesium niobate actuator of claim 12 wherein said externally threaded sleeve is provided with engagement means thereon to facilitate rotation of said sleeve in said threaded portion of said casing.

14. A lead magnesium niobate actuator for micropositioning which comprises:
   a) a cylindrical casing having an open end and a partially closed end, said partially closed end having a central opening therein of smaller diameter than the inner diameter of said casing;
   b) a cylindrical lead magnesium niobate crystal stack mounted within said casing and having a smaller diameter than the inner diameter of said casing, said crystal stack being electrically actuatable from a contracted position to an extended position;
   c) a head bonded to one end of said crystal stack;
   d) a shaft member received in said central opening in said partially closed end of said casing, said shaft member having:
      1) a threaded end portion outside of said casing;
      2) means on said shaft to permit flexure of said threaded end portion; and
      3) an enlarged head portion within said casing, said enlarged head portion of said shaft being operationally engagable by, but not bonded to, said head bonded to said one end of said crystal stack;
   whereby lateral movements and stresses are transmitted from said shaft to said crystal stack and said crystal stack may be removed from said casing without removing said shaft member from said casing;
   e) bias means located between the inner portion of said closed end of said casing and a surface on said enlarged head portion of said shaft, to urge said head portion of said shaft toward said one end of said crystal stack; and
   f) adjustable means within said casing and adjacent an opposite end of said crystal stack for adjustably urging said crystal stack against said enlarged head on said shaft;
   whereby said adjustable means and said bias means cooperate to exert an adjustable compressive force constantly against opposite ends of said crystal stack.

15. A lead magnesium niobate actuator for micropositioning which comprises:
   a) a cylindrical casing having an internally threaded open end and a partially closed end having a central opening therein of smaller diameter than the inner diameter of said casing;
   b) a cylindrical lead magnesium niobate crystal stack coaxially mounted within said casing and having a smaller diameter than the inner diameter of said casing, said crystal stack being electrically actuatable from a contracted position to an extended position;
   c) a hemispherical head bonded to one end of said crystal stack;
   d) entrance and exit ports in said casing to permit cooling means to circulate within said casing around said crystal stack;
   e) a bushing fitted into said central opening in said partially closed end of said casing, said bushing having a central bore therein;
   f) a shaft member received in said central bore in said sleeve in said partially closed end of said casing, said shaft member having a threaded end portion outside of said casing and an enlarged head portion within said casing, said enlarged head portion of said shaft having a conical opening in a surface thereon facing said one end of said crystal stack to receive said hemispherical head bonded to said one end of said crystal stack, to thereby operationally attach said one end of said crystal stack to said shaft member, while facilitating removal and replacement of said crystal stack without disconnection of said shaft member from external devices being actuated thereby;
   g) one or more grooves circumferentially formed on said shaft at a point external to said casing whereby lateral forces applied against said threaded end of said shaft will cause said shaft to flex at said one or more grooves and the transmission to said crystal stack of said lateral forces applied against the end of said shaft will be inhibited;
   h) spring bias means comprising one or more belleville washers located between the inner portion of said closed end of said casing and a surface on said enlarged head portion of said shaft to urge said head portion of said shaft toward said hemispherical head on said one end of said crystal stack, said one or more belleville washers having a friction-reducing coating thereon; and
   i) a cylindrical base member mounted to said opposite end of said crystal stack to coaxially position said cylindrical crystal stack within said casing, said cylindrical base member having an outer diameter approximately equal to the inner diameter of said casing to provide a snug fit therebetween;
   j) adjustable means within said casing and adjacent an opposite end of said crystal stack for adjustably urging said hemispherical head on said crystal stack against said enlarged head on said shaft to thereby compress said spring bias means, said adjustable means comprising an externally threaded sleeve received in said internally threaded open end of said casing, said threaded sleeve engages a shoulder portion of said cylindrical base member when said threaded sleeve is received in said open end of said casing, whereby said threaded sleeve may be rotated to urge said cylindrical base member, said crystal stack, and said enlarged head on said shaft, against said spring bias means to thereby adjust the compressive force on said crystal stack, said externally threaded sleeve having engagement means thereon to facilitate rotation of said sleeve in said threaded portion of said casing;
   whereby said adjustable means and said spring bias means cooperate to exert an adjustable compressive force constantly against opposite ends of said crystal stack.

16. A lead magnesium niobate actuator for micropositioning which comprises:
   a) a cylindrical casing having an open end and a partially closed end, said partially closed end having a central opening therein of smaller diameter than the inner diameter of said casing;
   b) a cylindrical lead magnesium niobate crystal stack coaxially mounted within said casing and having a smaller diameter than the inner diameter of said casing, said crystal stack being electrically actuatable from a contracted position to an extended position;
   c) a hemispherical head bonded to one end of said crystal stack;
   d) a shaft member received in said central opening in said partially closed end of said casing, said shaft member having a threaded end portion outside of said casing and an enlarged head portion within said casing, said enlarged head portion of said shaft having a conical opening in a surface thereon facing said one end of said crystal stack to receive said hemispherical head on said one end of said crystal stack, to thereby operationally attach said one end of said crystal stack to said shaft member, while permitting removal and replacement of said crystal stack without removal of said shaft member;

e) spring bias means located between the inner portion of said closed end of said casing and a surface on said enlarged head portion of said shaft to urge said head portion of said shaft toward said hemispherical head on said one end of said crystal stack; and f) adjustable means within said casing and adjacent an opposite end of said crystal stack for adjustably urging said hemispherical head on said crystal stack against said enlarged head on said shaft and to compress said spring bias means;

whereby said adjustable means and said spring bias means cooperate to exert an adjustable compressive force constantly against opposite ends of said crystal stack.

17. The lead magnesium niobate actuator of claim 16 wherein said spring bias means comprises one or more belleville washers.

18. The lead magnesium niobate actuator of claim 17 wherein said one or more belleville washers are initially compressed to about one half of their total compression by said adjustment means.

19. The lead magnesium niobate actuator of claim 16 wherein a bushing is fitted into said central opening in said partially closed end of said casing, and said shaft passes through a central bore in said bushing.

20. The lead magnesium niobate actuator of claim 16 wherein said shaft has one or more grooves circumferentially formed thereon at a point external to said casing whereby lateral forces applied against the end of said shaft will cause said shaft to flex at said one or more grooves and the transmission to said crystal stack of said lateral forces applied against the end of said shaft will be inhibited.

21. The lead magnesium niobate actuator of claim 16 wherein said casing is provided with entrance and exit ports to permit cooling means to circulate within said casing around said crystal stack.

22. The lead magnesium niobate actuator of claim 16 wherein a cylindrical base member is mounted to said opposite end of said crystal stack to coaxially position said cylindrical crystal stack within said casing, said cylindrical base member having an outer diameter approximately equal to the inner diameter of said casing to provide a snug fit therebetween.

23. The lead magnesium niobate actuator of claim 22 wherein said adjustable means comprises an externally threaded sleeve, said casing is provided with mating internal threads adjacent said open end thereof, and one end of said threaded sleeve engages a shoulder portion of said cylindrical base member when said threaded sleeve is received in said open end of said casing, whereby said threaded sleeve may be rotated to adjustable urge said cylindrical base member, said crystal stack bonded thereto, and said enlarged head on said shaft, against said bias means to compress said bias means to thereby exert a compressive force on said crystal stack; said externally threaded sleeve having engagement means thereon to facilitate rotation of said sleeve in said threaded portion of said casing.

24. A lead magnesium niobate actuator for micropositioning which comprises:

a) a cylindrical casing having an open end and a partially closed end, said partially closed end having a central opening therein of smaller diameter than the inner diameter of said casing;

b) a cylindrical lead magnesium niobate crystal stack mounted within said casing and having a smaller diameter than the inner diameter of said casing, said crystal stack being electrically actuatable from a contracted position to an extended position;

c) a shaft member received in said central opening in said partially closed end of said casing, said shaft member having a threaded end portion outside of said casing and an enlarged head portion within said casing, said enlarged head portion of said shaft being operationally attached to one end of said crystal stack;

d) bias means located between the inner portion of said closed end of said casing and a surface on said enlarged head portion of said shaft, to urge said head portion of said shaft toward said one end of said crystal stack;

e) spacer means located within said casing around said crystal stack to centrally position said crystal stack within said casing; and f) adjustable means within said casing and adjacent an opposite end of said crystal stack for adjustably urging said crystal stack against said enlarged head on said shaft;

whereby said adjustable means and said bias means cooperate to exert an adjustable compressive force constantly against opposite ends of said crystal stack.

* * * * *